United States Patent [19]

Swanke

[11] Patent Number: 5,081,705
[45] Date of Patent: Jan. 14, 1992

[54] COMMUNICATION SYSTEM WITH EXTERNAL REFERENCE SIGNAL PROCESSING CAPABILITY

[75] Inventor: Christopher J. Swanke, Cedar Rapids, Iowa

[73] Assignee: Rockwell International Corp.

[21] Appl. No.: 374,513

[22] Filed: Jun. 29, 1989

[51] Int. Cl.$^5$ .............................................. H04B 1/38
[52] U.S. Cl. ..................................... 455/73; 455/103; 455/260; 331/18; 331/DIG. 2
[58] Field of Search ....................... 455/73, 75, 76, 51, 455/52, 103, 260, 296; 375/119, 120, 107; 331/2, 47, 18, DIG. 2

[56] References Cited

U.S. PATENT DOCUMENTS

| | | |
|---|---|---|
| 3,646,269 | 2/1972 | Fudemoto et al. . |
| 3,940,558 | 2/1976 | Gabbard et al. . |
| 3,967,060 | 6/1976 | Subramanian . |
| 4,151,485 | 4/1979 | LaFratta . |
| 4,188,582 | 2/1980 | Cannalte et al. ...................... 455/51 |
| 4,466,110 | 8/1984 | Kizaki et al. . |
| 4,633,193 | 12/1986 | Scordo . |
| 4,644,568 | 2/1987 | Canniff et al. . |
| 4,672,299 | 6/1987 | Grimes et al. . |
| 4,745,371 | 5/1988 | Haine ..................................... 331/25 |
| 4,817,199 | 3/1989 | Wallraff .............................. 455/260 |

*Primary Examiner*—Reinhard J. Eisenzopf
*Assistant Examiner*—Edward Urban

[57] ABSTRACT

The present invention comprises a communication system including a number of independently operating equipment modules in which the operations of these modules are referenced to a common external signal and thereby phase synchronized in order to reduce intra-system interference. The system includes a number of phase lock loop type processing circuits one of which is associated with each equipment module for tracking the external reference signal and generating a base reference for use by module with which each processing circuit is associated. The system takes advantage of the inherent capabilities of phase lock loop circuits to provide a base reference for each equipment module which is characterized by a frequency spectrum having a reduced level of spurious signals and noise. The preferred embodiment includes components for automatically switching between internally and externally generated reference signals and for automatically converting an external reference signal to a standard frequency.

4 Claims, 2 Drawing Sheets

COMMUNICATION SYSTEM WITH EXTERNAL REFERENCE SIGNAL PROCESSING CAPABILITY

BACKGROUND OF THE INVENTION

This invention relates to communications systems and more specifically to communications systems including multiple independent communications modules which may be referenced to a common external signal.

Modern communication systems for use on vehicles such as aircraft frequently include a variety of communications equipment and a number of independently operating communications modules for such purposes as voice communication, data links, and satellite feeds. Since vehicular platforms are of limited size, these modules are often in relatively close physical proximity to one another to the extent that they may electrically interfere with each others operation. In order to help control this problem, the individual communications modules comprising the system may be referenced to a single external signal which functions as a source for the reference base used by each of the modules, thereby phase synchronizing their operations. Referencing the modules within the system to a single external signal does not totally eliminate intra-system interference but does assist in regulating such interference by giving the associated distortion a more regular and predictable pattern which is less disruptive to communications functions and more easily controlled.

The external reference signal supplied in common between the modules is not suitable in itself for use as a reference base by the individual modules since it is subject to substantial amounts of distortion and may be at a different frequency than the required base signal. Therefore, past systems in which individual equipment modules have been referenced to a single external signal have included narrow band pass filters and frequency dividers/multipliers for carefully filtering and accurately translating the external reference signal to form a suitable reference base for each individual equipment unit. Since the reference base must be a very stable, accurate and clean signal, it has been expensive and difficult to provide the circuitry necessary to perform the required filtering and translating functions. Furthermore, the processing circuits previously provided have had limited flexibility and have required manual switching at each module to select between external and internally generated reference signals and to select for reference signals having different frequencies.

It is therefore an object of the present invention to provide a communications system comprising individual modules which are referenced to a single external signal and in which the modules are provided with reference base signals having improved stability and accuracy as well as being subject to less interference and distortion.

It is another object of the present invention to provide a communication system in which the individual modules within the system may automatically switch from internally generated reference signals to a single external signal supplied in common to the modules.

It is a further object of the present invention to provide a communication system having multiple independent modules referenced to a single external signal in which the individual modules can automatically adjust to external reference signals of different frequencies.

It is yet another object of the present invention to provide a communication system having multiple, independent modules which have the capability for automatically switching between reference signals, for adjusting to external reference signals of different frequencies and in which the reference base signals provided to the equipment modules are of improved quality having a frequency spectrum with a reduced level of spurious signals and noise.

It is a yet further object of the present invention to provide a communication system including modules referenced to a common external signal having improved capabilities for processing the external signal and in which the processing circuitry necessary to achieve these ends reflects high standards of design and yet is economical to manufacture.

SUMMARY OF THE INVENTION

The invention comprises a communication system having a number of independently operating equipment modules such as radio transceivers handling different communications functions in which the operations of these units are referenced to a common external signal and thereby phased synchronized in order to reduce interference between the individual modules which make up the system. The system also includes a number of phase lock loop type circuits one of which is associated with each of the equipment units for tracking the external reference signal and generating a base reference signal for use by the equipment module with which it is associated. The system takes advantage of the inherent capabilities of phase lock loop circuits to efficiently filter and translate the external reference and to provide a base reference for each equipment module which is characterized by a frequency spectrum having a reduced level of spurious signals and noise.

The preferred embodiment of the present invention further includes a number of detection and switching components one of which is associated with each equipment module and each phase lock loop circuit for automatically switching the inputs provided to the phase lock loop circuits between reference signals generated internally to each equipment module and the external reference signal supplied in common between all of the units in the system. Additionally, the preferred embodiment includes a number of frequency conversion units one of which is associated with each module and phase lock loop circuit for translating the frequency of the external reference signal to a standard frequency suitable for processing by the phase lock loop circuit in response to lock indication signals from the phase lock loop circuit.

In operation, an external reference signal is distributed in common to all of the communication modules making up the system. The detection and switching components respond to the presence of this signal by automatically channeling the external reference signal to the frequency conversion units which then automatically convert the frequency of the external reference to a standard frequency for input to the phase lock loop circuits. The phase lock loop circuits filter and translate these standard reference signals to stable, clean and substantially distortion free base reference signals suitable for use by the individual equipment modules comprising the system.

DESCRIPTION OF THE PREFERRED EMBODIMENT

Figure 1:
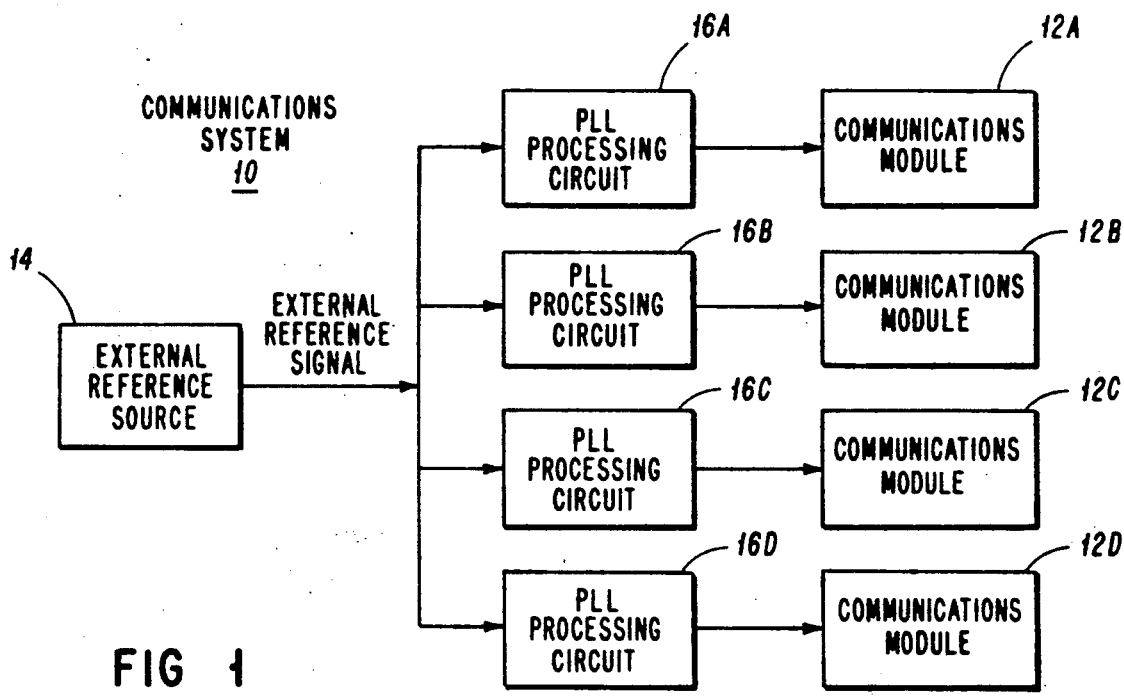
FIG. 1 is a functional block diagram providing an overall view of a communications system of the type that includes a number of different communications modules and in which the present invention may be usefully employed.

Referring now to FIG. 1, a communications system 10 in accordance with the present invention includes a number of communications modules 12A-D such as radio transceivers which operate independently of one another and may be used for different types of information transfer purposes. The communication modules 12A-D are located in physical and, more importantly, electrical proximity to one another. They may be, for example, installed on a vehicular platform such as an aircraft where space limitations force the equipment modules to be located nearby each other. The proximity of the modules 12A-D can lead to unpredictable and irregularly occurring distortion due to interference between the modules when they are concurrently operating.

In order to help resolve this distortion problem, the communications modules 12A-D are referenced to a single external signal provided by the external source 14 in order to phase synchronize their operations. This external signal is distributed to each of the communications modules 12A-D and is processed by phase lock loop type processing circuits 16A-D one of which is associated with each of the communication modules 12A-D and which provide a separate reference base signal for use in each of the modules characterized by a frequency spectrum having a reduced level of spurious signals and noise. The processing circuits 16A-D filter and translate the external reference signal to provide a substantially stable and clean, frequency coherent and distortion free signal. Further, the processing circuits 16A-D detect the presence of an external reference signal and automatically switch to and from an internally generated reference signal depending on whether an external reference is supplied. Additionally, the processing circuits 16A-D automatically determine which of a finite number of predetermined external reference frequencies is being employed and convert the frequency of the external signal to an equipment standard.

Figure 2:
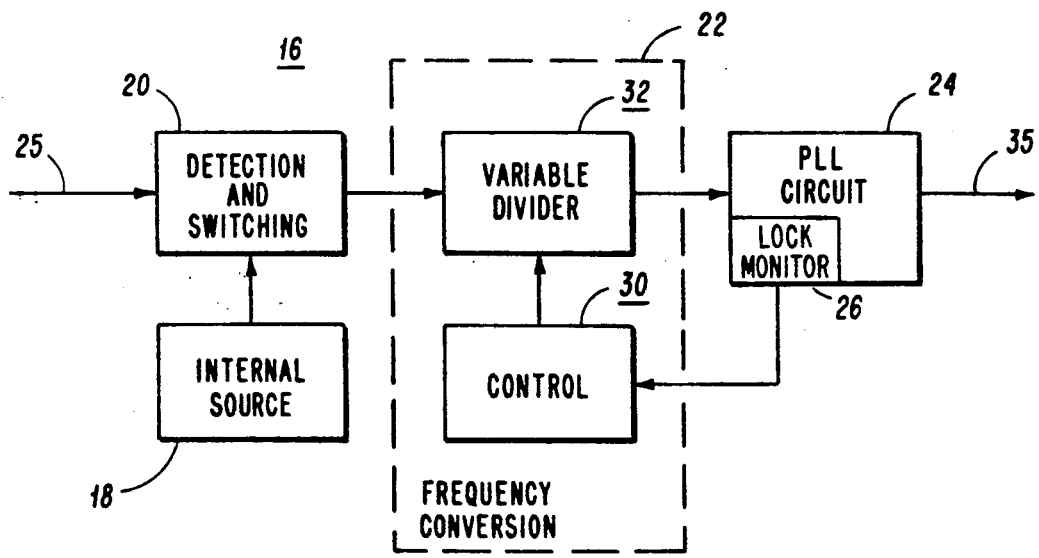
FIG. 2 is a functional block diagram providing an overall view of a processing circuit unit in accordance with the present invention.

Referring now to FIG. 2, a representative processing circuit 16 is shown as including a detection and switching component 20, a frequency conversion unit 22 (shown in phantom) comprising a control component 30 and a divider 32 and a phase lock loop circuit 24. The detection and switching component 20 senses when an external reference signal is present on the line 25 and channels this signal through to the frequency conversion unit 22 when it is available. Otherwise, when an external reference signal is not present on the line 25, the detection and switching component 20 channels an internal reference signal from an internal source 18 associated with the processing circuit to the frequency conversion unit 22. The frequency conversion unit 22 works in cooperation with the phase lock loop circuit 24 to convert the frequency of the reference signal from the detection and switching component 20 to an acceptable standard. The phase lock loop circuit 24 includes a lock monitor 26 providing a lock indication signal which is furnished to the control component 30. The control component 30 uses the information carried by this signal to properly regulate the operation of the divider 32 so that the signal from the detection and switching component 20 can be suitably divided to provide a signal of standard frequency to the phase lock loop circuit 24.

Reviewing the overall operation of the processing circuit 16, the detection and switching component 20 automatically switches between external and internally generated referenced signals. The frequency conversion unit 22 automatically converts the reference signal provided by the detection and switching component 20 to a standard reference frequency based on lock information provided by the phase lock loop circuit 24. Finally, the phase lock loop circuit 24 filters and translates the external reference signal to a stable and clean reference base furnished on line 35 for use by the equipment module with which the processing circuit 16 is associated.

Figure 3:
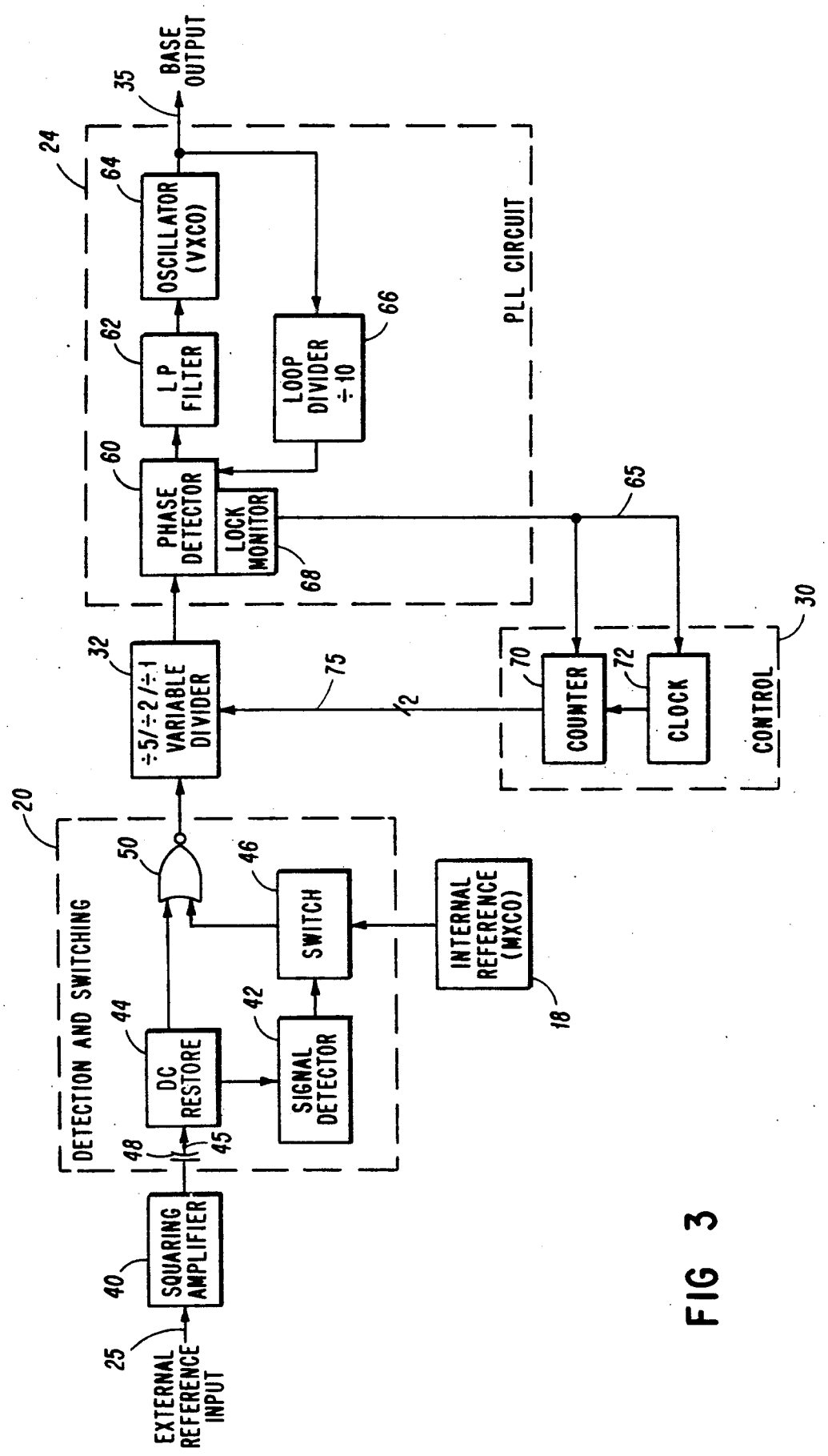
FIG. 3 is a functional block diagram providing a detailed view of the circuitry for a processing circuit unit in accordance with the present invention.

Referring now to FIG. 3, a specific embodiment of the present invention is shown in greater detail. The external reference input signal on line 25 is first provided to a squaring amplifier 40 for preprocessing of the signal to convert it to a square wave. A typical squaring amplifier 40 might include AC coupling into three inverting logic gates, such as National Semiconductor HCU04s, connected in series and configured through a 470K ohm feedback resistor for proper biasing. The output of the squaring amplifier 40 is also AC coupled through the capacitor 48 since the squaring amplifier output voltage will float to an indeterminate logic state when undriven (i.e., no external reference input) and the coupled signal is referenced to ground to achieve a logic low when there is no external reference input. The DC restore circuit 44 returns the coupled signal to standard digital logic levels (e.g., 5 volt) when there is an external reference input. The DC restore circuit 44 may consist of a diode with its cathode attached to the coupled output and its anode grounded. The DC restored signal is furnished to the NOR-Gate 50 and to the signal detector 42. The signal detector 42 is responsive to the voltage of the signal supplied to it and provides a high logic voltage digital signal to the switch 46 only when a voltage corresponding to the presence of a external reference signal is detected. The signal detector may suitably comprise a filter for converting the square wave to a DC voltage and a comparator configured to compare the DC voltage from the filter to a specific voltage threshold. When the signal detector 42 provides a high logic level signal to the switch 46, the switch 46 is disabled from passing the internal reference signal from the internal reference source 18 and passes a logic low to the NOR-Gate 50. Otherwise, when the signal detector 42 provides a low logic level signal to the switch 46, the internal reference signal from the internal reference source 18 is passed through the switch 46 to the NOR-Gate 50.

In operation, the circuits comprising the detection and switching component 20 function to insure that a proper reference signal is provided to the variable divider 32. When an external reference signal is present on the line 45, the signal detector 42 controls the switch 46 to block the input of the internal reference signal to the NOR-Gate 50, thereby allowing the external reference signal to proceed directly through the DC restore circuit 44 and the NOR-Gate 50 to the variable divider 32. The NOR-Gate 50 acts as a transmitting mechanism for either the internal reference signal or the external reference signal depending on the presence of the external signal and the state of the signal detector 42.

The variable divider 32 receives the signal from the detection and switching component 20 and divides it down by factors such as 5, 2 and 1 in accordance with a control signal provided by the control component 30 (shown in phantom) in order to provide a signal of standard frequency for supply to the phase lock loop circuit 24 (now shown in phantom). This standard frequency signal is input to the phase detector 60 of the phase lock loop circuit 24. The phase lock loop circuit 24 is constructed and arranged in the conventional fashion with the output of the phase detector 60 being supplied to an oscillator 64 by way of a low pass filter 62 and with the output of the oscillator being fed back to the phase detector 60. The phase lock loop circuit 24 is, however, specially adapted for use in the present invention by inclusion of the loop divider 66 for dividing the feedback signal by a substantial factor (e.g. 10), use of a phase frequency detector such as a Motorola MC-4044 having a lock monitor 68 for providing a lock indication signal and use of a voltage controlled crystal oscillator as the loop oscillator 64. The loop divider 66 allows for the translation of the input signal to the loop circuit from the variable divider 32 to the required frequency for the base reference to be used by the communications module with which the processing circuit 16 is associated. The lock monitor 68 supplies lock information to the control component 30 and more specifically the counter 70 and clock 72 which enables the generation of a proper control signal for supply to the variable divider 32. Through use of a voltage controlled crystal oscillator, frequency stability is promoted and the production of a stable and clean output signal for service as the base reference signal for the communications module is ensured.

The control component 30 includes the previously referenced counter 70 and clock 72 which are arranged to be responsive to the lock indication signal from the lock monitor 68 on the line 65. The clock 72 provides relatively long duration, such as 400 millisecond pulses which are long enough to allow for loop lock acquisition time, to the counter 70 whenever the lock indication signal is in a logic low state indicating a non-locked condition in the phase lock loop 24. Likewise, the output of the counter 70 is enabled by a logic low signal from the lock monitor 68 and counts the pulses from the clock 72, stepping through different digital signal patterns provided as outputs on the lines 75. The variable divider 32 is adapted to respond to these control signals by dividing down its input signal by factors such as 5, 2 and 1 depending on the input signal pattern received from the counter 70. It should be noted that it may be desirable to filter the output of the lock monitor 68 to provide a more stable output to the control component 30.

In operation, the control component 30 responds to the lock indication signal from the lock monitor 68 to step the variable divider 32 through various division factors until a reference signal of standard frequency is provided to the phase detector 60 which allows the phase lock loop circuit 24 to achieve a proper lock. The processing circuit 16 is thereby enabled to process a number of different external reference signals of varying frequency by automatically adjusting its operations to the input frequency and providing a stable reference base at a set frequency.

Moreover, phase lock loop circuit 24 employed in the present invention for filtering and translating the signal from the variable divider 32 provides an extremely stable and accurate reference base for the equipment due to the inherent properties of phase lock loop circuits and especially the narrow bandwidth of the voltage controlled crystal oscillator-phase lock loop. The overall bandwidth of the phase lock loop may be in the range of 40 Hertz when configured with a loop divider dividing by a substantial factor such as of 10 as in the present case.

Reviewing the overall operation of the processing circuit 16, the circuit is responsive to the presence or absence of an external reference signal on the line 25 with the detection and switching component 20 channeling the external reference signal through to the variable divider 32 when it is present and, alternatively, channeling an internal reference signal from an internal source 18 to the variable divider 32 when an external reference signal is not present. The reference signal provided to the detection and switching component 20 is divided down in the variable divider 32 by one of a predetermined number division factors in accordance with control signals provided by the control component 30. The control component 30 operates in response to lock indication signals from phase lock loop circuit 24 and controls the variable divider 32 to change division factors until a positive lock indication signal is received indicating that a signal of appropriate frequency is being provided to the phase lock loop circuit 24. The phase lock loop circuit 24 filters and translates the reference signal provided by the variable divider 32 so as to provide a base reference signal characterized by a frequency spectrum having a reduced level of spurious signals and noise as well as furnishing the lock indication signal governing the operation of the control component 30.

While particular embodiments of the present invention have been shown and described, it should be clear that changes and modifications may be made to such embodiments without departing from the true scope and spirit of the invention. It is intended that the appended claims cover all such changes and modifications.

I claim:

1. A system for phase synchronizing the operation of a plurality of communication modules to a common external reference signal which may assume any one of a number of predetermined frequencies, comprising:

a plurality of phase lock loop circuits including lock monitor subcircuits providing lock indication signals, one of which loop circuits is associated with each of said modules, for tracking said external reference signal and generating a base reference signal of a specified frequency for use by the module with which it is associated, said base reference signal characterized by a frequency spectrum having a reduced level of spurious signals and noise; and an automatic control circuit adapted for responding to and processing said external reference signal, including:

a variable divider arranged for translating said external reference signal to a standard frequency, and means for controlling said divider in response to said lock indication signal to select said standard frequency for input to each of said phase lock loop, each said means for controlling including:
a timer circuit for providing pulse output signals in response to a negative lock indication signal from the phase lock loop with which the control circuit is associated with, and
a counter circuit responsive to the pulse output signals from sad timer circuit for supplying digital control signals to said variable divider.

2. The system of claim 1, further including:
a plurality of switching means one of which is associated with each of said modules for automatically switching the inputs to said phase lock loop circuits between reference signals generated internally to said modules and said external reference signal.

3. The system of claim 1, wherein:
said phase lock loop circuits are constructed and arranged to provide said base reference signal at approximately ten times the frequency of said external reference frequency in order to reduce the effective bandwidths of said phase lock loop circuits.

4. The system of claim 1, wherein said phase lock loop circuits include:
voltage controlled crystal oscillator.

* * * * *